(12) United States Patent
Chen (10) Patent No.: US 6,624,898 B1
(45) Date of Patent: Sep. 23, 2003

(54) WAFER SUPPORTING PLATE

(75) Inventor: Brad Chen, Hsinchu (TW)

(73) Assignees: Promos Technologies, Inc., Hsinchu (TW); Mosel Vitelic, Inc., Hsinchu (TW); Infineon Technologies of Infineon Technologies Inc., Munich (DE)

( * ) Notice: Subject to any disclaimer, the term of this patent is extended or adjusted under 35 U.S.C. 154(b) by 491 days.

(21) Appl. No.: 09/595,268

(22) Filed: Jun. 15, 2000

(51) Int. Cl.[7] ............................................. G01B 11/14
(52) U.S. Cl. ...................... 356/614; 356/621; 250/548
(58) Field of Search ................................ 356/614, 621, 356/622, 400, 401; 250/548, 559.29

(56) References Cited

U.S. PATENT DOCUMENTS

| | | | | |
|---|---|---|---|---|
| 4,887,904 A | * | 12/1989 | Nakazato et al. | 356/375 |
| 5,917,601 A | * | 6/1999 | Shimazaki et al. | 356/375 |
| 6,122,036 A | * | 9/2000 | Yamasaki et al. | 355/53 |
| 6,172,373 B1 | * | 1/2001 | Hara et al. | 250/548 |
| 6,201,603 B1 | * | 3/2001 | Miura | 356/375 |

* cited by examiner

Primary Examiner—Frank G. Font
Assistant Examiner—Layla Lauchman
(74) Attorney, Agent, or Firm—Darby & Darby (57) ABSTRACT

A wafer supporting plate suitable for supporting a wafer during a semiconductor-forming process. In particular, the present invention relates to a wafer supporting plate capable of sensing the positioning condition of the wafer on the supporting plate during a heat treatment or other semiconductor-forming processes for detecting whether the wafer is being positioned normally on the supporting plate. The wafer supporting plate comprises a supporting plate body, at least three supporting props disposed on the supporting plate body for receiving and supporting a wafer, at least three sensing devices each disposed besides the supporting props and within the range encircled by the supporting props on the supporting plate body respectively. Furthermore, the wafer supporting plate of the present invention is provided with a logic circuit connected to the sensing devices which can be triggered by the sensing devices to suspend the semiconductor-forming process being performed on the wafer as soon as one of the sensing devices detects an abnormality in the positioning condition of the wafer at the location of the supporting props.

7 Claims, 8 Drawing Sheets

WAFER SUPPORTING PLATE

BACKGROUND OF THE INVENTION

1. Field of the Invention

The present invention relates to a wafer supporting plate suitable for supporting a wafer during a semiconductor-forming process; more particularly, the invention relates to a wafer supporting plate capable of sensing the positioning condition of the wafer on the supporting plate during a heat treatment or other semiconductor-forming processes for detecting whether the wafer is being positioned nomally on the supporting plate.

2. Description of the Related Art

At present, semiconductor wafers tend to have larger and larger sizes, wherein the manufacturing techniques for forming wafers have evolved from 6-inch wafers, 8-inch wafers, and now towards the 12-inch wafers. The increases in wafer size means that the manufacturing cost of each wafer also has to be increased to keep up with newer technologies. Therefor, it is inevitable, and not surprisingly, that the semiconductor industry has been working hard on how to reduce the redundancy rate of the wafers handled during the manufacturing procedure as well as to minimize the pollution problem resulted from improper processing of the damaged wafers.

Figure 1:
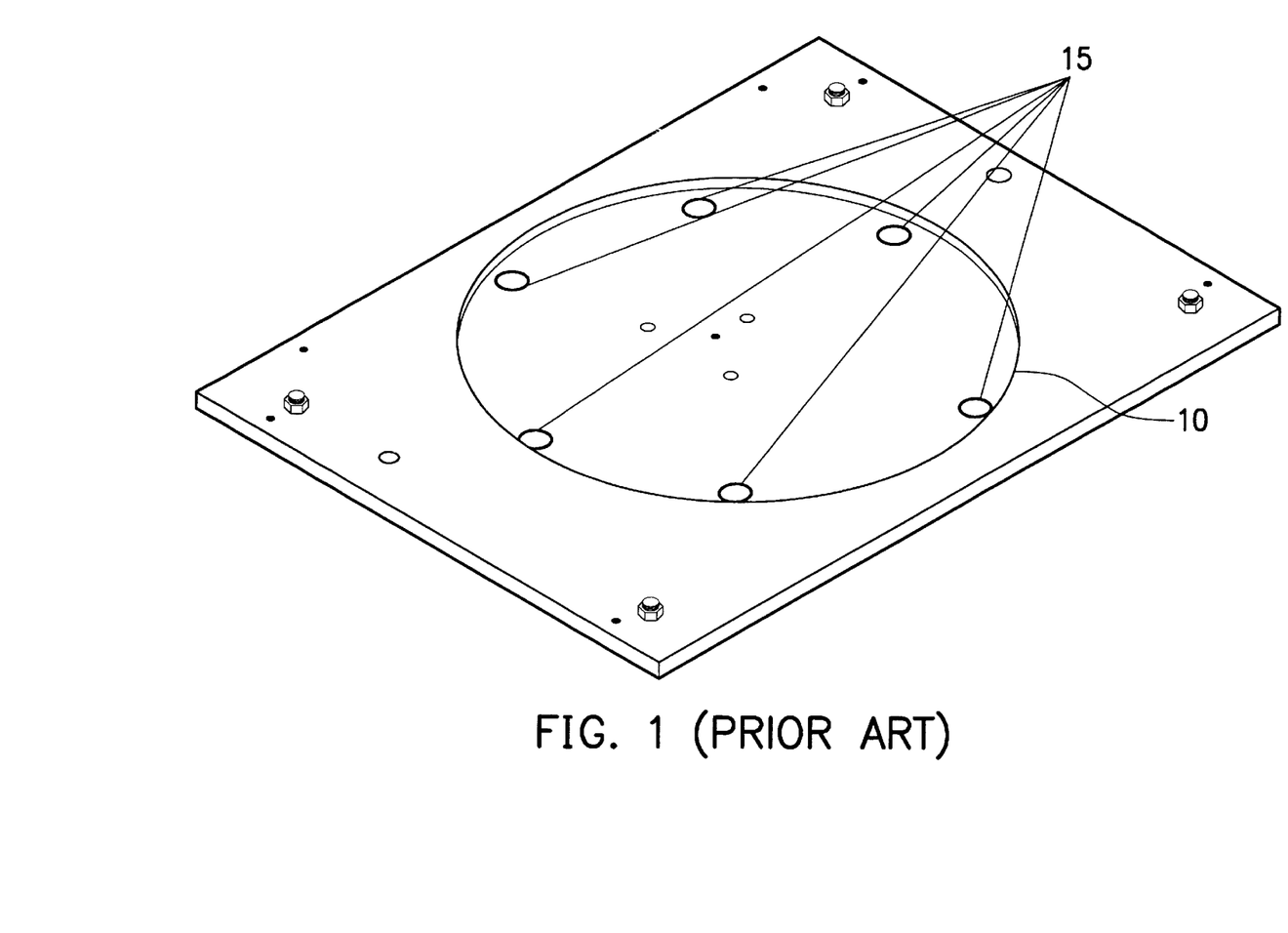
FIG. 1 shows a conventional wafer supporting apparatus.
Figure 2A:
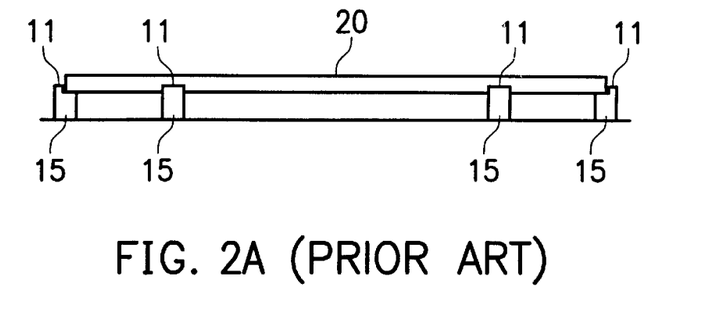
FIG. 2A shows a sectional view of the conventional wafer supporting apparatus shown in FIG. 1.
Figure 2B:
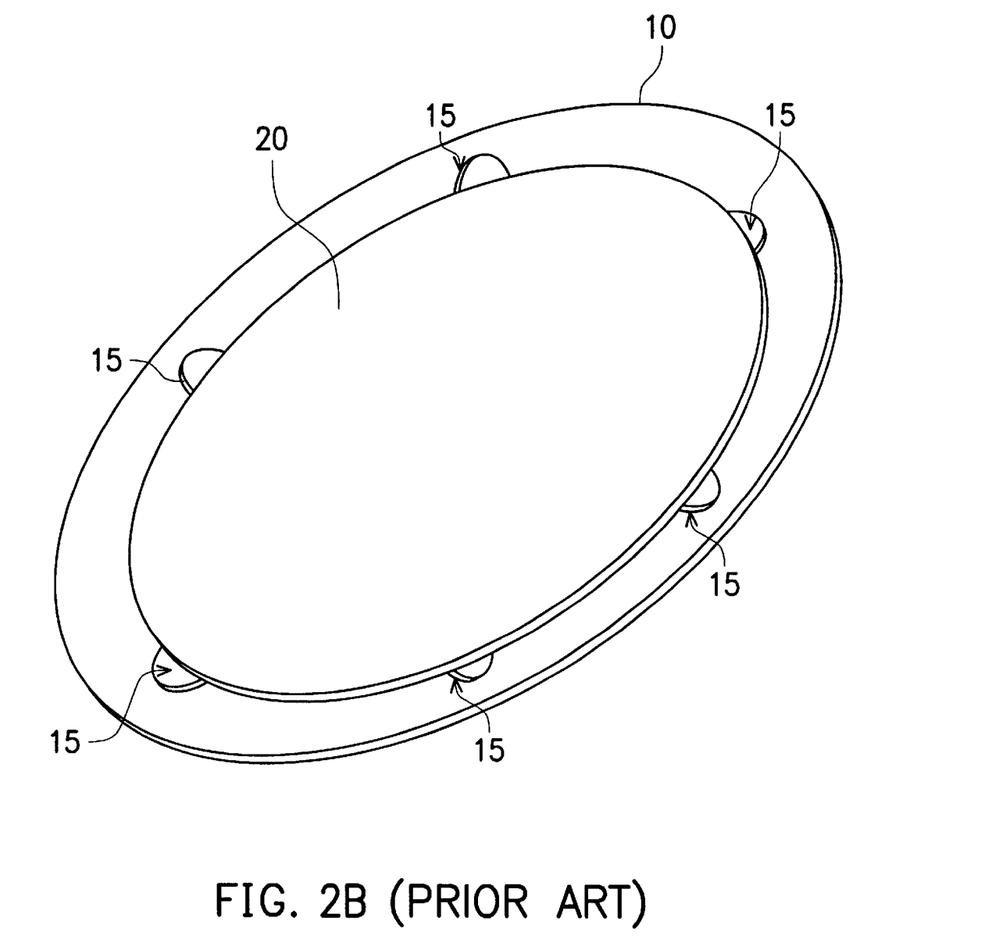
FIG. 2B is a perspective view of the conventional wafer supporting apparatus shown in FIG. 1.

The situation in which the wafers are damaged occurs mostly frequently when the wafers are processed in a wafer storage chamber or a reaction chamber or when the wafers are conveyed to different locations by a carrier. As shown in FIG. 1, a general wafer supporting apparatus for the manufacture of wafers is presented according to a conventional method, wherein the wafer manufacturing system shown comprises a supporting plate 10. In addition, at least three supporting props 15 are provided on the supporting plate 10. The supporting props 15 are typically not arranged in-line; instead, the supporting props 15 are arranged into a n-agon shape, where n≧3. For example, FIG. 2A and FIG. 2B illustrate a hexagon arrangement of the supporting props 15 whereby a wafer 20 is placed on the supporting plate 10. Each of the supporting prop surface 11 supports the wafer 20 by contacting the rim, and the wafer forms a plane parallel to the plane formed by the supporting plate.

However, the supporting plate and the automatic manipulator such as a mechanical arm that carry the wafer tend to lose their positioning precision due to the long running period. As a result, the wafer cannot be located to the predetermined positions, and such a dislocated wafer when being processed in a reaction chamber, for example, can not be accepted since an uneven temperature distribution or chemical deposition, erratic exposure, scratching, or sometimes even crashing between the wafers may occur, which can eventually wreck the reaction chamber.

Moreover, the defective wafers typically are not sorted out until a great extent of the manufacturing process has been carried out, which, in other words, means that the operator or engineer who is in charge of handling the process can not be well informed before or during the occurrence of a mishap. As a result, the manufacturing cost has to be increased-while the projected time of delivery is delayed. The above problem is further complicated since the engineer or operator can not trace the exact cause of the problem that produces the faulty wafer, which makes the situation even more difficult and therefore increases the required time for repairing.

SUMMARY OF THE INVENTION

To solve the problems described above, an embodiment of the present invention provides a wafer supporting plate comprising a plurality of sensing devices capable of sensing the positioning condition of the wafer on the supporting plate during a heat treatment or other semiconductor-forming processes for judging whether the wafer is being positioned normally on the supporting plate. For example, if the positioning condition of the wafer being processed is detected by the above-mentioned sensing devices to be in a state of abnormality, the process is suspended immediately. This preventive measure, according to the present invention provides a safeguard to the wafers being processed so that none of which can be scratched or even cracked; furthermore, the present invention provides a quick way of tracing the cause of an abnormal positioning of a wafer for shortening the repairing or adjusting time of a machine.

Accordingly, the present invention provides a wafer supporting plate suitable for semiconductor manufacturing, comprising a supporting plate body, at least three supporting props disposed on the supporting plate body for receiving and supporting a wafer, at least three sensing devices each disposed besides the supporting props and within the range encircled by the supporting props on the supporting plate body respectively for detecting whether all of supporting props are supporting the wafer normally or optimally.

In addition, another embodiment of the present invention provides a wafer supporting plate further comprising a logic circuit connected to the sensing devices which can be triggered by the sensing devices to suspend the semiconductor-forming process being performed on the wafer as soon as one of the sensing devices detects an abnormality in the positioning condition of the wafer at the location of the supporting props.

BRIEF DESCRIPTION OF THE DRAWINGS

The present invention will be made more fully understood from the detailed description and the accompanying drawings given herein below by way of illustration only and thus not intended to be limitative of the present invention.

DETAILED DESCRIPTION OF THE PREFERRED EMBODIMENT

Reference is now made in detail to a heat treatment plate of a TRACK system for illustrating the following embodiments of the present invention in their best modes. However, modifications may be made without deviating from the spirit and the scope of the present invention; wherein, the present invention may be applied to various equipments of having similar function including a single-wafer or a multi-wafer conveying system.

Accordingly, it is a preferred embodiment of the present invention to configure a plurality of sensing devices such as at least three laser emitter/detector units onto the plane surface of a supporting body for detecting the positioning condition of a wafer on a supporting plate so as to check the presence of the wafer and to detect if the wafer on the supporting plate is overhanging or slanting.

Furthermore, it is another embodiment of the present invention to provide a logic circuit connected to the laser emitter/detector units for generating a series of logic commands to a manufacturing process.

Figures 3A, 3B:
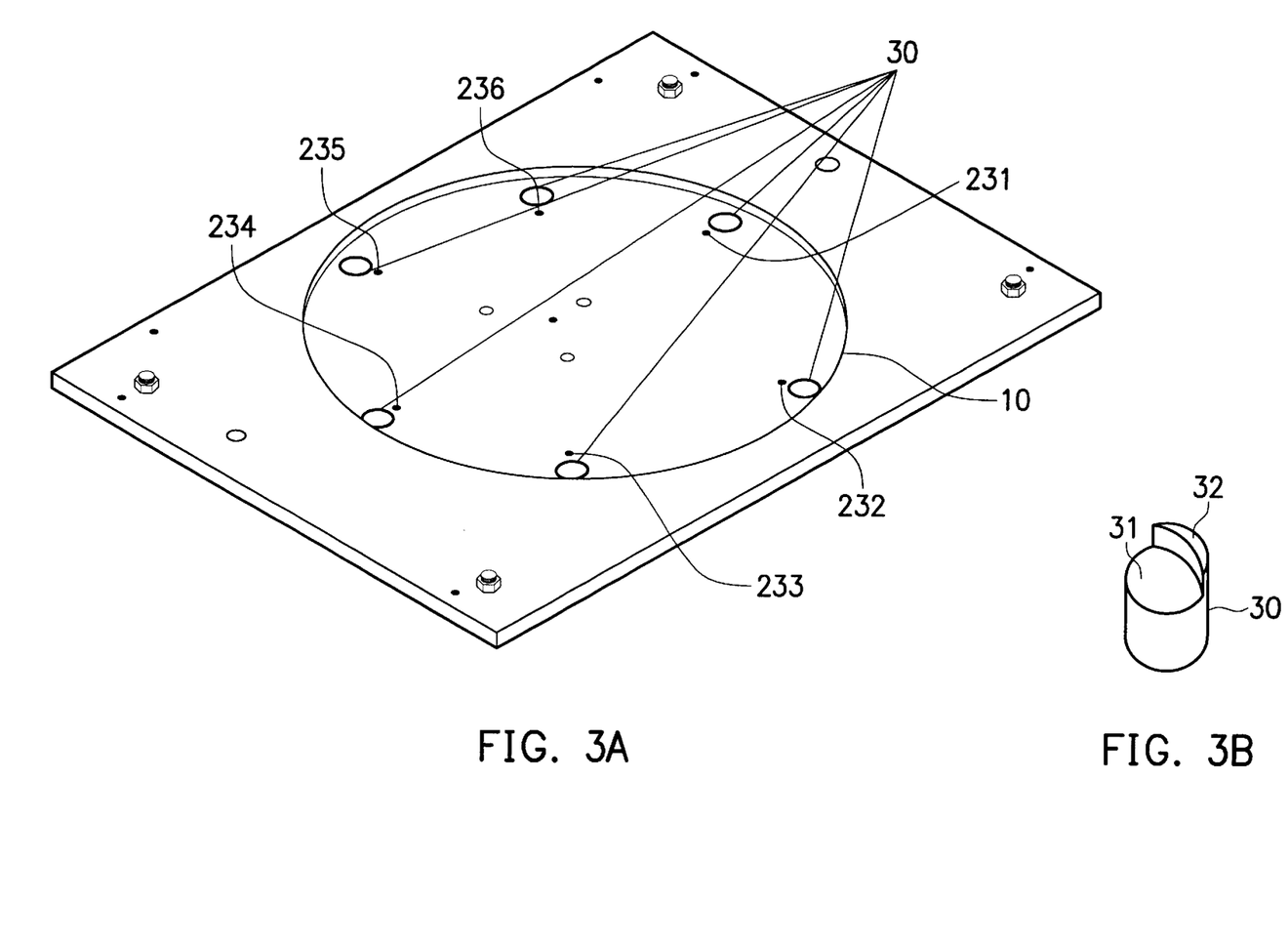
FIG. 3A shows a perspective view of the wafer supporting plate according to a preferred embodiment of the present invention.
FIG. 3B is a perspective view illustrating a supporting prop of the wafer supporting plate shown in FIG. 3A.
Figure 3C:
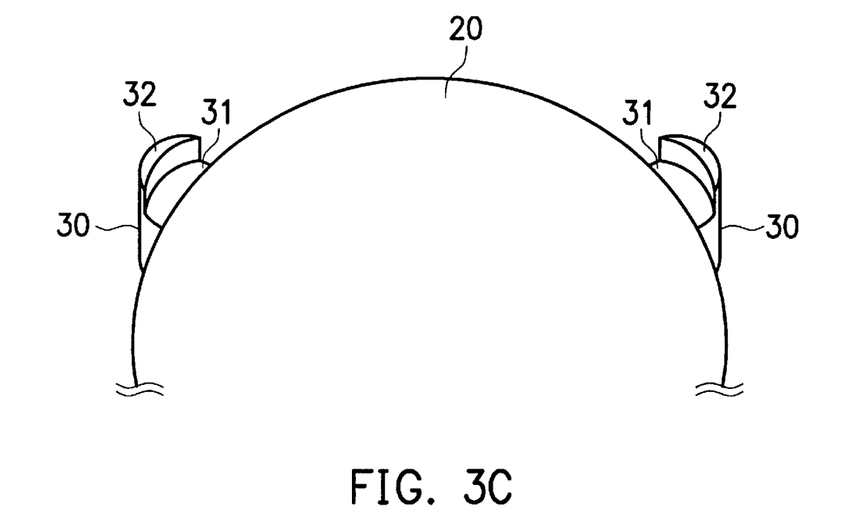
FIG. 3C is a perspective view illustrating the preferred positioning condition of a water supported by a supporting prop according the present invention.
Figure 3D:
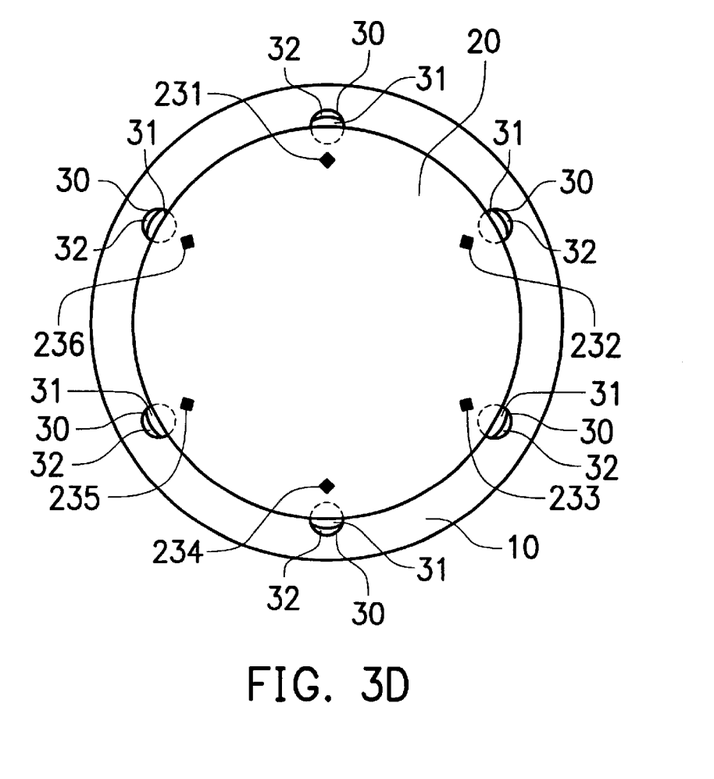
FIG. 3D is a top view illustrating the positioning condition of the wafershown in FIG. 3C.

As shown in FIG. 3A, a wafer supporting plate 10 of a TRACK system for heat treatment is provided according to the preferred embodiment of the present invention, wherein the TRACK system is a semiconductor lithography machine. Referring to FIG. 3C, a wafer 20 is conveyed to the wafer supporting plate 10 of the TRACK system by an automatic manipulator. Wherein, the wafer supporting plate 10 as shown in FIG. 3D comprises six supporting props 30 disposed thereon equidistantly in a hexagonal arrangement. Wherein, each of the supporting props 30 includes a supporting surface 31 and a stopper 32 as shown in FIG. 3B. When the wafer 20 is placed on the supporting surface 31 of the supporting props 30, it is the rim of the wafer 20 that is being supported. In addition, referring to FIG. 3C, each of the supporting props 30 is provided with a stopper 32 formed jutting upwardly atop each of the supporting surface 31 for restraining the movement of the wafer 20 in the horizontal direction, which, when all of the stoppers 32 function together, prevents the wafer 20 from falling off the supporting surfaces 31. Finally, referring to FIG. 3D, the present invention further comprises six laser emitter/detector pairs 231, 232, 233, 234, 235, and 236 mounted on the wafer supporting plate 10 besides the supporting props 30. Each of the emitter/detector pairs is located next to a corresponding supporting props 30 and is in a closer vicinity to the center of the supporting plate than the corresponding supporting props 30.

Figure 4:
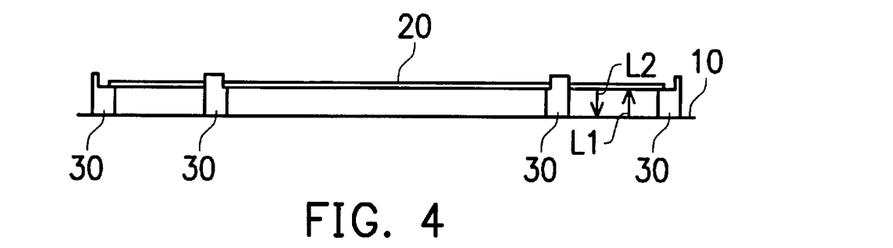
FIG. 4 is a side view of a wafer on the wafer supporting plate in a preferred positioning condition according to the present invention.

FIG. 4 is a side view of a wafer on the wafer supporting plate in a preferred positioning condition according to the present invention. The preferred positioning condition means that the wafer being supported is preferably in contact with all of the supporting surfaces of the six supporting props 30 while the center of the wafer aligns with the center of the supporting plate directly below. Since each of the six supporting props 30 is provided with the same height as the others, the wafer supported in the preferred positioning condition atop the supporting props 30 is supposedly parallel to the bottom plane of the supporting plate and hence is levelled. Thereby, when the wafer is baked in the TRACK heat treatment equipment, heat can be evenly distributed to the wafer.

Figure 5A:
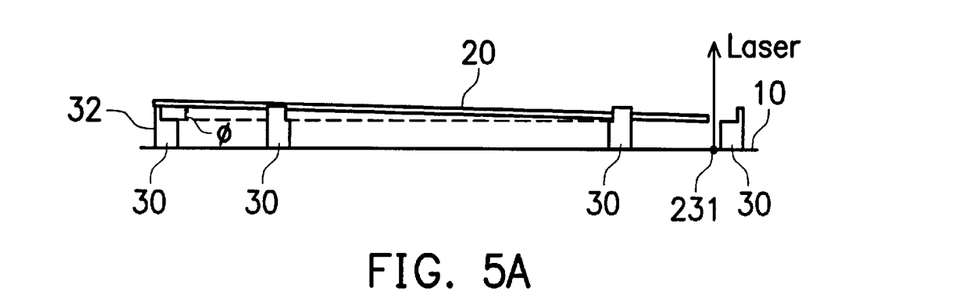
FIG. 5A shows another side view of a wafer on the wafer supporting plate where an example of unacceptable positioning condition is demonstrated.
Figure 5B:
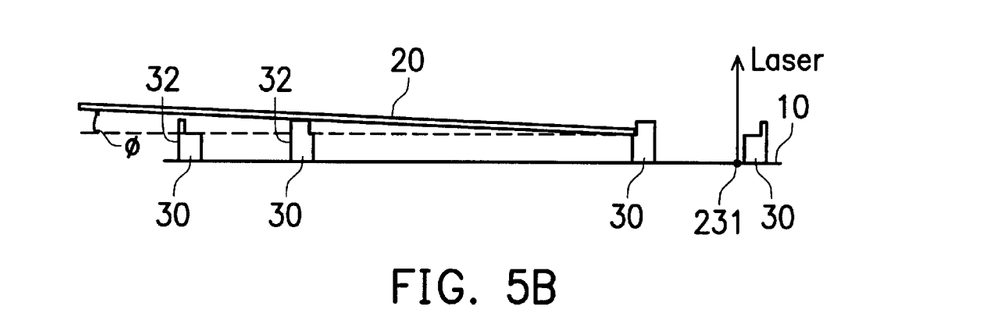
FIG. 5B shows another side view of a wafer on the wafer supporting plate where an example of unacceptable positioning condition is demonstrated.
Figure 5C:
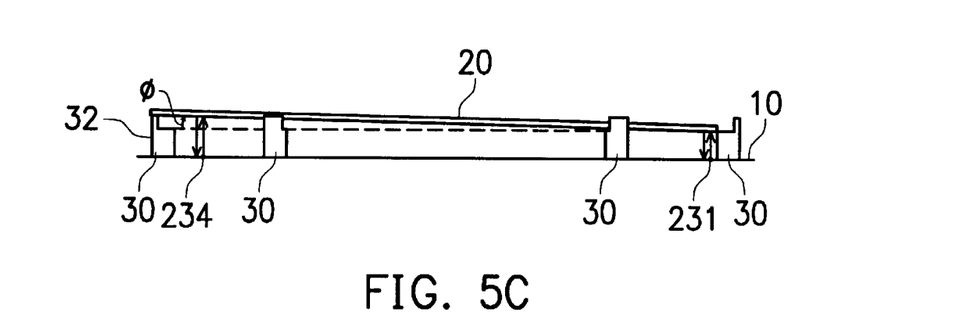
FIG. 5C shows still another side view of a wafer on the wafer supporting plate where an example of unacceptable positioning condition is demonstrated.

FIG. 5A, 5B, 5C each shows a side view of a wafer 20 on the wafer supporting plate 10 respectively where an example of unacceptable positioning condition is demonstrated. The dislocation of the wafer as demonstrated may be due to the loss of displacement precision in a mechanical arm. The unacceptable positioning condition may be that a portion of the wafer rested on top of one of more stoppers 32, which makes the distance between the wafer and the bottom of the supporting plate unequal at different wafer locations. As a consequence, poor uniformity in the heat absorption by the wafer occurs when the wafer is baked and results in CD non-uniformity in the later process. The yield rate will be sacrificed and evenmore, the wafers might need to be scrapped.

Figure 6:
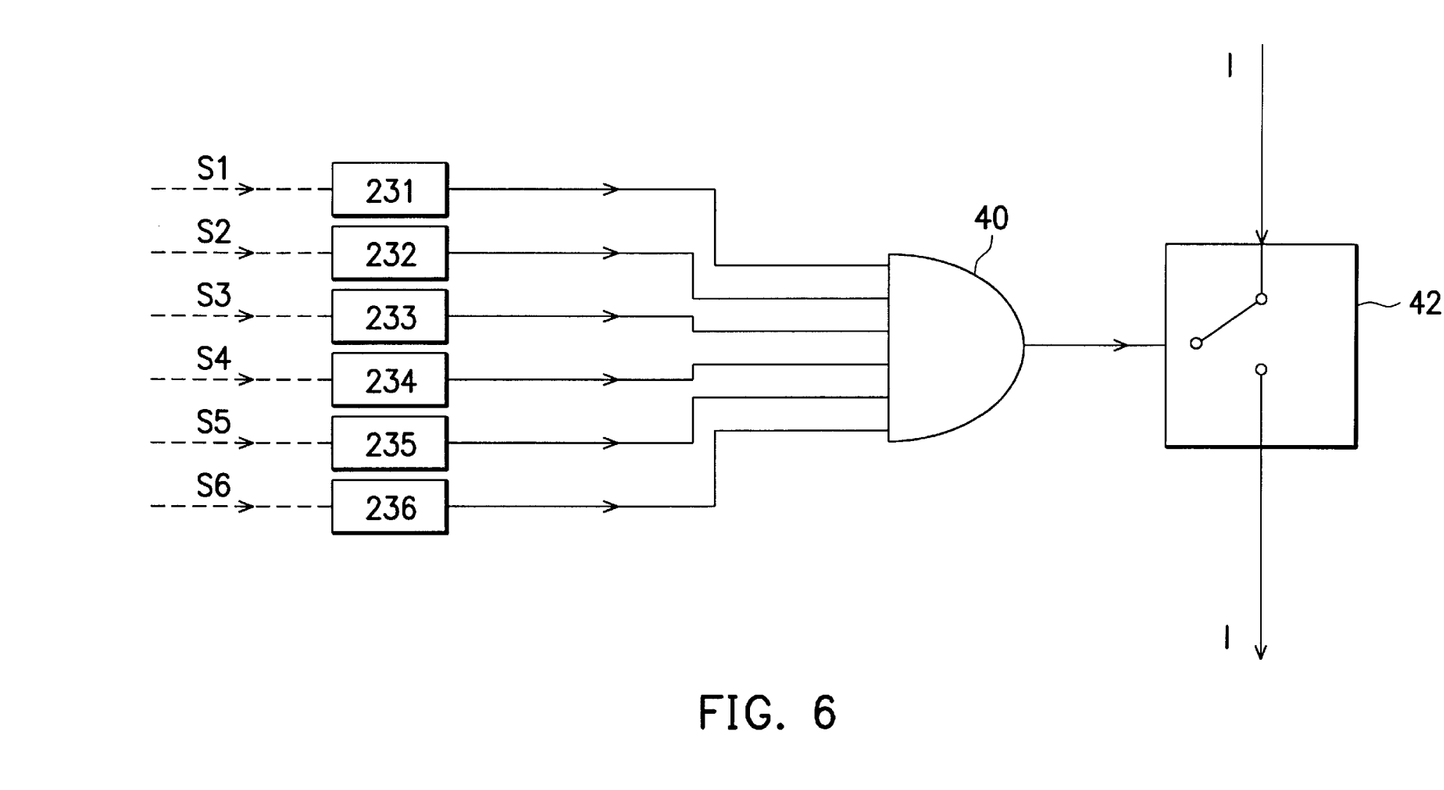
FIG. 6 shows a schematic diagram of a logic circuit in accordance with another preferred embodiment of the present invention.

FIG. 6 shows a schematic diagram of a logic circuit in accordance with another preferred embodiment of the present invention. Accordingly, the logic circuit shown comprises an AND gate 40 which contains six input terminals and a output terminal; wherein, the six input terminals are connected to corresponding laser emitter/detector pairs 231, 232, 233, 234, 235, and 236 respectively. In addition, the logic circuit comprises a current switch 42 that enables a manufacturing process for the wafers when each laser emitter/detector pair emits a high level signal of logic 1 simultaneously to the AND gate 40 so as to close the current switch 42 by a high level logic signal to allow the passage of a current I. On the other hand, when any one of the laser emitter/detector pairs described above emits a low level signal of logic 0 to the AND gate 40, a low level signal is outputted by the AND gate 40 to open the current switch 42 that disables a manufacturing process in progress. The operation of the logic circuit is further illustrated with reference to FIG. 6 as follows.

Figure 7:
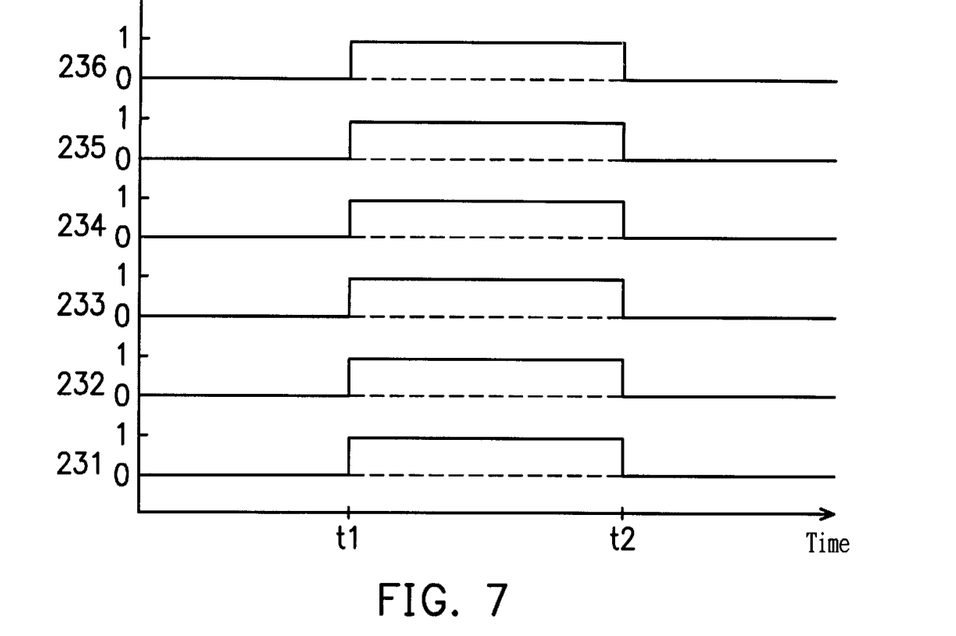
FIG. 7 is a graph showing the relevant logic wave pulses outputted by corresponding laser emitter/detector units according to the present invention.

Referring to FIG. 4 and FIG. 7, a wafer 20 is placed in a preferred positioning condition on the wafer supporting plate 10. When each of the six laser emitter/detector units 231, 232, 233, 234, 235, and 236 simultaneously emits a laser beam L1, the beam is projected vertically onto the bottom of the wafer. After being partially absorbed by the wafer 20, the laser beam L2 is each reflected back by the wafer 20 to the corresponding laser emitter/detector unit that. Since the laser beams are emitted from the six laser emiter/detector units 231, 232, 233, 234, 235, and 236 simultaneously, the six laser beams will all be reflected back to the corresponding six laser emitter/detector units 231, 232, 233, 234, 235, and 236 simultaneously if the wafer is placed on the wafer supporting plate 10 in a correct position. Furthermore, the six laser emitter/detector units 231, 232, 233, 234, 235, and 236 then each sends out a logic signal 1 to the AND gate 40 synchronously in a time span from t1 to t2 as shown in FIG. 7. After the AND gate receives every one of the logic signals 1 outputted from the six laser emitter/detector units 231, 232, 233, 234, 235, and 236, the AND gate sends out a high level signal of logic 1 to switch on the current switch 42 so as to enable a manufacturing process for the wafers 20.

Figure 8:
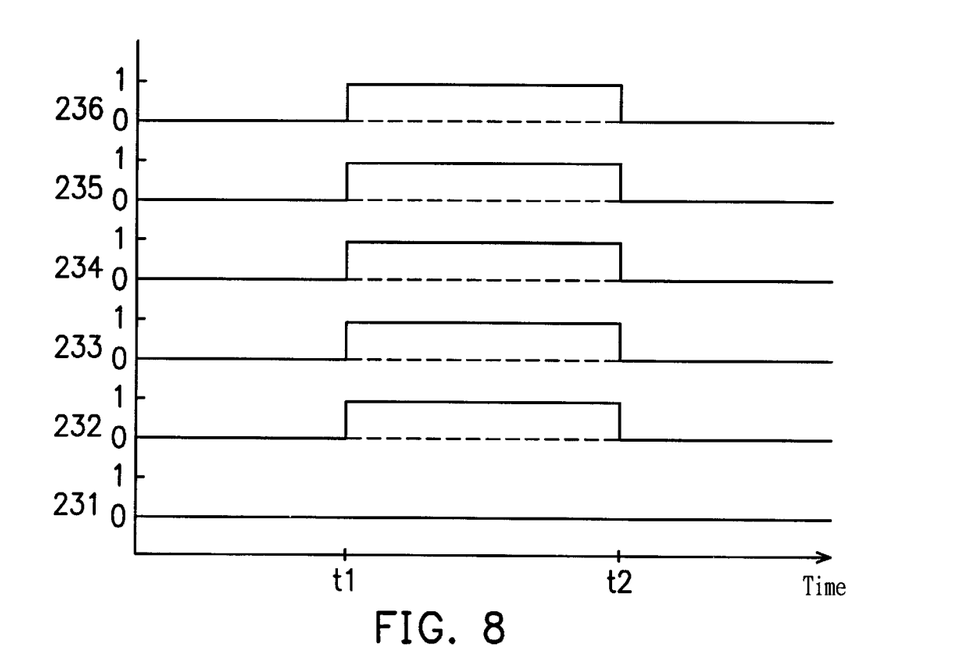
FIG. 8 is a graph showing the relevant logic wave pulses outputted by corresponding laser emitter/detector units according to the present invention.

Now referring to FIG. 5A and FIG. 8, the wafer 20 shown in FIG. 5A is not placed correctly on the wafer supporting plate 10 such that an angle Φ is created between the wafer supporting plate 10 and the wafer 20, and that one of stoppers 32 is crossed over by the wafer 20. Under this circumstance, the laser beam emitted from the laser emitter/receiver 231, for example, cannot be projected to the bottom of the wafer 20 and reflected back. As a result, only five of the six laser beams emitted simultaneously by the six laser emitter/detector units 231, 232, 233, 234, 235, and 236 are projected onto the bottom of the wafer 20 with a small angle Φ. Since the angle Φ is so small such that the reflected beams can still be detected by the laser emitter/detector devices after being absorbed partially by the bottom of the wafer 20, which in turn triggers the five laser emitter/detector units 232, 233, 234, 235, and 236 to each simutaneouly send a logic signal 1 to the AND gate 40 in the time span from t1 to t2. However, since the laser emitter/detector unit 231 cannot detect a reflected laser beam, the laser emitter/detector 231 therefore responds by sending out a logic signal 0 to the AND gate. After the AND gate 40 have received mixed signals of logic 1s and 0s from the six laser emitter/detector units 231, 232, 233, 234, 235, and 236, it then outputs a low level signal of logic 0 to cause the current switch 42 to be open so as to disable an ongoing manufacturing process for wafers.

Figure 9:
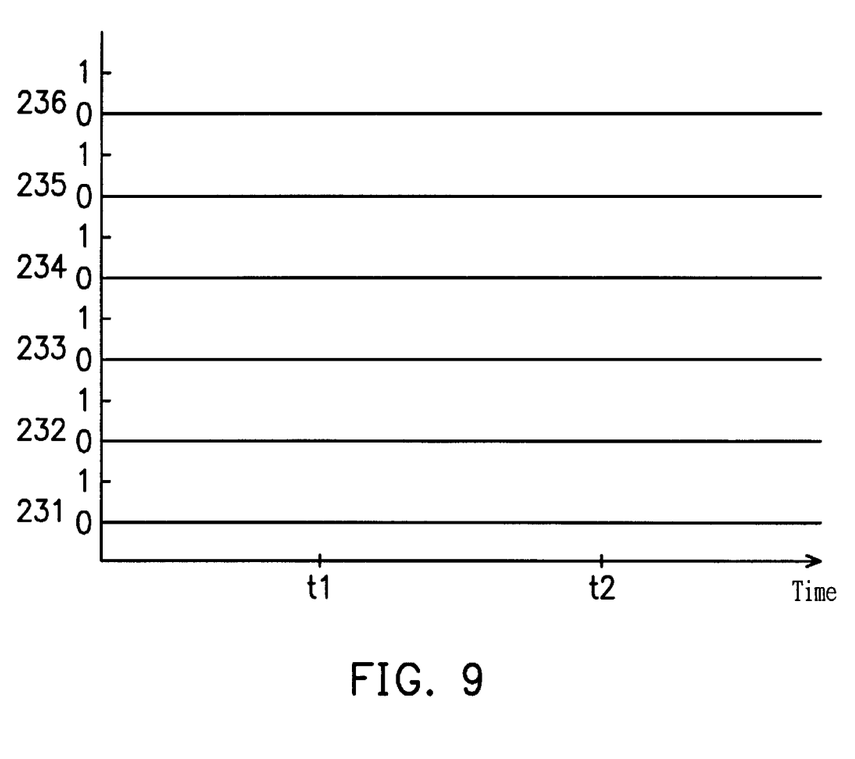
FIG. 9 is a graph showing the relevant logic wave pulses outputted by corresponding laser emitter/detector units according to the present invention.

Referring to FIG. 5B and FIG. 9, another example of an unacceptable positioning condition is shown in which a wafer 20 is placed incorrectly on the wafer supporting plate 10, which causes an angle Φ to be formed between the wafer 20 and the wafer supporting plate 10. Referring to FIG. 5B, the wafer 20 crosses over two of the stoppers 32 and forms an angle Φ between the wafer 20 and the wafer supporting plate 10 too large for laser beams to be projected onto three laser emitter/detector units 234, 235, and 236. That is to say, only three of the six laser emitter/detector units 231, 232, 233, 234, 235, and 236 that emit the laser beam simultaneously can project laser beams onto the bottom of the wafer due to the large angle Φ. Furthermore, in accordance with the Snell's law, all of the reflected laser beams are unable to be received or detected by the corresponding laser emitter/detector units. As a result, all six laser emitter/detector units 231, 232, 233, 234, 235, and 236 send out a logic signal 0 to the AND gate 40. And after the AND gate 40 have received each of the logic signal 0s from the laser emitter/detector units 231, 232, 233, 234, 235, and 236, a low level signal of logic signal 0 is outputted by the AND gate 40 to cause the current switch 42 to be open so as to disable an ongoing manufacturing process for wafers.

As described above, the logic pulse waves shown in FIG. 7 to FIG. 9, respectively, may be analyzed and generated by a computer such as a personal computer or a work station integrated in a manufacturing system, for further enhanciing the output of an analyzed result to the technician or engineer who is operating the manufacturing system.

Other types or forms of emitter/detector including a micro emitter/detector, a light-emitting diode, or a laser emitter/detector etc. can also be adopted here to serve the same function as the above-mentioned emitter/detector units 231, 232, 233, 234, 235, and 236. Thus, the present invention provides a quick way of tracing the cause of an abnormal positioning of a wafer for shortening the repairing or adjusting time of a machine.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer supporting plate capable of detecting the positioning condition of a wafer supported thereon, comprising:
   a supporting plate body;
   at least three supporting props disposed on the supporting plate body for receiving and supporting said wafer; and
   at least three detecting devices disposed correspondingly besides said supporting props and within the range encircled by said supporting props on said supporting plate for detecting whether said wafer is being supported by all of said supporting props.

2. The wafer supporting plate as claimed in claim 1, wherein each of said supporting props comprises a wafer supporting surface for supporting said wafer directly from below and a stopper formed jutting upwardly atop each of the supporting surface for retaining the wafer.

3. The wafer supporting plate as claimed in claim 1, wherein said detecting devices are laser emitter/detector units.

4. A wafer supporting plate capable of detecting the positioning condition of a wafer supported thereon while supporting the weight of a wafer during a semiconductor-forming process, comprising:
   a supporting plate body;
   at least three supporting props disposed on the supporting plate body for receiving and supporting said wafer;
   at least three detecting devices disposed correspondingly besides said supporting props and within the range encircled by said supporting props on said supporting plate for detecting whether said wafer is being supported by all of said supporting props; and
   a logic circuit connected to said detecting devices so as to be triggered by any one of the detecting devices to suspend the semiconductor-forming process being performed on the wafer as soon as one of the detecting devices detects an abnormality in the positioning condition of the wafer.

5. A wafer supporting plate capable of detecting the positioning condition of a wafer supported thereon while supporting the weight of a wafer during a semiconductor-forming process, comprising:
   a supporting plate body;
   at least three supporting props disposed on the supporting plate body for receiving and supporting said wafer;
   at least three detecting devices disposed correspondingly near said supporting props and within the range encircled by said supporting props on said supporting plate for detecting whether said wafer is being supported by all of said supporting props; and
   a logic circuit connected to said detecting devices so as to be triggered by any one of the detecting devices to suspend the semiconductor-forming process being performed on the wafer when one of the detecting devices detects an abnormality in the positioning condition of the wafer;
   wherein said logic circuit comprises at least:
     an AND gate including a plurality of input terminals and an output terminal, wherein each of said input terminals is connected correspondingly to one of said detecting devices for receiving a signal of logic 1 or 0 from each of the detecting devices via an input terminal, respectively, and then outputting a signal of logic 1 or 0 via the output terminal; and a current switch connected to said output terminal of said AND gate to receive the signal of logic 1 or 0 outputted by the AND gate; wherein an open circuit is formed in said current switch to suspend said semiconductor-forming process if said output terminal of said AND gate outputs a signal of logic 0.

6. A wafer supporting plate capable of detecting the positioning condition of a wafer supported thereon while supporting the weight of a wafer during a semiconductor-forming process, comprising:

a supporting plate body;

at least three supporting props disposed on the supporting plate body for receiving and supporting said wafer, each of said supporting props comprises a wafer supporting surface for supporting said wafer directly from below and a stopper formed jutting upwardly atop each of the supporting surfaces for retaining the wafer;

at least three detecting devices disposed correspondingly beside said supporting props and within the range encircled by said supporting props on said supporting plate for detecting whether said wafer is being supported by all of said supporting props; and a logic circuit connected to said detecting devices so as to be triggered by any one of the detecting devices to suspend the semiconductor-forming process being performed on the wafer as soon as one of the detecting devices detects an abnormality in the positioning condition of the wafer;

wherein said logic circuit comprises at least:

an AND gate including a plurality of input terminals and an output terminal, wherein each of said input terminals is connected correspondingly to one of said detecting devices for receiving a signal of logic 1 or 0 from each of the detecting devices via an input terminal, respectively, and then outputting a signal of logic 1 or 0 via the output terminal; and a current switch connected to said output terminal of said AND gate to receive the signal of logic 1 or 0 outputted by the AND gate; wherein an open circuit is formed in said current switch to suspend said semiconductor-forming process if said output terminal of said AND gate outputs a signal of logic 0.

7. A wafer supporting plate capable of detecting the positioning condition of a wafer supported thereon while supporting the weight of a wafer during a semiconductor-forming process, comprising:

a supporting plate body;

at least three supporting props disposed on the supporting plate body for receiving and supporting said wafer, each of said supporting props comprises a wafer supporting surface for supporting said wafer directly from below and a stopper formed jutting upwardly atop each of the supporting surface for retaining the wafer;

at least three laser emitter/detector units disposed correspondingly beside said supporting props and within the range encircled by said supporting props on said supporting plate for detecting whether said wafer is being supported by all of said supporting props; and a logic circuit connected to said laser emitter/detector units so as to be triggered by any one of the laser emitter/detector units to suspend the semiconductor-forming process being performed on the wafer as soon as one of the laser emitter/detector units detects an abnormality in the positioning condition of the wafer;

wherein said logic circuit comprises at least:

an AND gate including a plurality of input terminals and an output terminal, wherein each of said input terminals is connected correspondingly to one of said laser emitter/detector units for receiving a signal of logic 1 or 0 from each of the laser emitter/detector units via an input terminal, respectively, and then outputting a signal of logic 1 or 0 via the output terminal; and a current switch connected to said output terminal of said AND gate to receive the signal of logic 1 or 0 outputted by the AND gate; wherein an open circuit is formed in said current switch to suspend said semiconductor-forming process if said output terminal of said AND gate outputs a signal of logic 0.

* * * * *